(12) United States Patent
Husted et al.

(10) Patent No.: US 8,498,368 B1
(45) Date of Patent: *Jul. 30, 2013

(54) METHOD AND SYSTEM FOR OPTIMIZING GAIN CHANGES BY IDENTIFYING MODULATION TYPE AND RATE

(75) Inventors: Paul J. Husted, Palo Alto, CA (US); William J. McFarland, Los Altos, CA (US); Teresa H. Meng, Portola Valley, CA (US); John S. Thomson, Santa Clara, CA (US)

(73) Assignee: QUALCOMM Incorporated, San Diego, CA (US)

( * ) Notice: Subject to any disclaimer, the term of this patent is extended or adjusted under 35 U.S.C. 154(b) by 3446 days.

This patent is subject to a terminal disclaimer.

(21) Appl. No.: 10/367,049

(22) Filed: Feb. 14, 2003

Related U.S. Application Data

(63) Continuation-in-part of application No. 09/833,749, filed on Apr. 11, 2001, now Pat. No. 7,027,530.

(51) Int. Cl.
*H04L 27/08* (2006.01)

(52) U.S. Cl.
USPC ..... 375/345; 375/316; 455/232.1; 455/241.1; 455/245.1

(58) Field of Classification Search
USPC ........ 375/345, 316; 330/254, 278; 455/232.1, 455/241.1, 245.1; 342/92
See application file for complete search history.

(56) References Cited

U.S. PATENT DOCUMENTS

| | | | |
|---|---|---|---|
| 5,519,548 A * | 5/1996 | Liepe et al. | 360/65 |
| 5,812,523 A | 9/1998 | Isaksson et al. | |
| 6,002,723 A * | 12/1999 | Chethik | 375/317 |
| 6,009,129 A | 12/1999 | Kenney et al. | |
| 6,188,717 B1 | 2/2001 | Kaiser et al. | |
| 6,192,070 B1 | 2/2001 | Poon et al. | |
| 6,246,698 B1 * | 6/2001 | Kumar | 370/487 |
| 6,392,570 B1 | 5/2002 | Bucht | |
| 6,400,928 B1 * | 6/2002 | Khullar et al. | 455/67.11 |
| 6,456,670 B1 | 9/2002 | Kindler et al. | |
| 6,505,037 B1 * | 1/2003 | Kandala | 455/277.2 |
| 6,549,561 B2 | 4/2003 | Crawford | |
| 6,711,221 B1 | 3/2004 | Belotserkovsky et al. | |
| 6,735,423 B1 * | 5/2004 | Uskali et al. | 455/249.1 |
| 6,747,569 B2 * | 6/2004 | Hill et al. | 340/855.8 |

(Continued)

FOREIGN PATENT DOCUMENTS
WO    WO 99/21287    4/1999

OTHER PUBLICATIONS

International Search Report—PCT/US2002/011214, ISA/US, Aug. 7, 2002.

*Primary Examiner* — Leila Malek

(74) *Attorney, Agent, or Firm* — Bever, Hoffman & Harms, LLP

(57) ABSTRACT

In some wireless local area networks (WLANs), signals of different modulation types and rates can be received. To operate optimally, the gain of an amplifier in a receiver can be set based on a specific modulation type and rate. For example, the gain of a receive path amplifier can be changed based on one or more unique identifying characteristics in a received data packet. Once the unique identifying characteristics are located, they can be analyzed to determine which modulation type and rate are represented. The appropriate gain of the amplifier can be set based on the modulation type and rate. Advantageously, subsequent data symbols can be amplified with the set gain, thereby ensuring that the receiver optimally receives those data symbols.

20 Claims, 7 Drawing Sheets

U.S. PATENT DOCUMENTS

| | | | |
|---|---|---|---|
| 6,850,493 B1 * | 2/2005 | Ojard et al. ............... 370/252 |
| 6,882,679 B2 * | 4/2005 | Somayazulu et al. ........ 375/146 |
| 7,027,530 B2 | 4/2006 | McFarland et al. |
| 2002/0094050 A1 | 7/2002 | Usui et al. |

\* cited by examiner

METHOD AND SYSTEM FOR OPTIMIZING GAIN CHANGES BY IDENTIFYING MODULATION TYPE AND RATE

RELATED APPLICATIONS

This application is a continuation-in-part of U.S. patent application Ser. No. 09/833,749 entitled, "Method And Apparatus For Maximizing Receiver Performance Utilizing Mid-Packet Gain Changes", filed on Apr. 11, 2001.

BACKGROUND OF THE INVENTION

1. Field of the Invention

The present invention relates to a receive path amplifier, and in particular to optimizing gain changes of this amplifier by identifying the modulation type and rate of a received packet.

2. Discussion of the Related Art

In a communication system, receivers are electronic devices that receive incoming signals and are very well known. Certain types of digital receivers have the ability to receive incoming signals that are transmitted with different modulation types. A modulation type generically refers to the type of information that can be added to a signal and to the signal's format. Modulation types can include, for example, Orthogonal Frequency Division Multiplexing (OFDM), Complementary Code Keying (CCK), Discrete Multi-Tone (DMT), and Extended Range (XR). Each modulation type can further include a modulation mapping, which generically indicates how that information is added to the signal. Modulation mappings can include, for example, binary phase shift keying (BPSK), quadrature phase shift keying (QPSK), or quadrature amplitude modulation (64QAM or 16 QAM). Each of these mappings can have an associated modulation rate. Thus, a single receiver can, at different times, receive signals having different modulation types, mappings, and rates.

Generally, it is advantageous to use a more complex modulation mapping if possible, since more information can be communicated for a given bandwidth using a modulation mapping that is more complex. But which modulation mapping to use at different times can depend on various criteria. For instance, when a communication channel is good, the transmitter may try to transmit at a high data rate with a complex modulation mapping, e.g. 64 QAM. However, when the channel is poor, a lower data rate with a less complex modulation mapping, e.g. BPSK, may be used. When switching between modulation mappings, the transmitter will commonly include a header that is modulated using the lower data rate. This header will typically also include an indication of the data rate used for the rest of the packet. A receiver can typically detect and demodulate this lowest common denominator signal at the lower data rate.

Most receivers can provide variable gain, i.e. amplification to an incoming signal, because of possible changes to channel conditions, circuit characteristics, etc. that could necessitate having different gains at different times. Accordingly, variable gain is used to optimize the amplification of the received signals within the dynamic range of the receiver. For example, if the gain is set too low, noise from various amplifiers and mixers in the receiver could be significant compared to the size of the desired signal, thereby degrading performance. A signal to noise ratio (SNR) refers to the ratio of the amplitude of the incoming signal to the amplitude of noise signals at a given point in time. On the other hand, if the gain is set too high, signals in nearby channels could cause the amplifiers and mixers in the receiver to perform non-linearly, e.g. clip or saturate, thereby degrading system performance. Blocker tolerance refers to the ability of a receiver to successfully filter out such nearby signals and still receive the incoming signals. For example, a receiver should still receive incoming signals even if signals 20 MHz away and 16 dB larger than the incoming signals are present. Similarly, a receiver should still receive incoming signals even if signals 40 MHz away and 32 dB larger than the incoming signals are present. Filtering is typically provided by one or more low pass filters in the receiving path to assist in lowering the size of the blocking signals, but this filtering only helps any blocks beyond the filters in the receive chain.

FIG. 1A illustrates the desired SNR as well as blocker tolerance for high bit rate signals and low bit rate signals. A high bit rate is typical of highly modulated signals (e.g. 64QAM), which are generally difficult to receive. Therefore, a high bit rate preferably has an associated high SNR (line 103) that should not exceed a linearity limit (line 101) for the receiver components. In contrast, a low bit rate is typical of less modulated signals and therefore can be easily received but can be more easily influenced by signals in nearby channels. Therefore, a low bit rate preferably has an associated high blocker tolerance (line 104) that should be greater than the ambient noise level (line 102).

Of importance, amplification of the incoming signals is performed before low pass filtering. Therefore, the gain (and thus the signal scaling) should be carefully adjusted in the receive chain. The optimum signal sizing is just large enough to insure that any circuit noise remains small enough relative to the signal size that successful communication can be maintained. By keeping the gain at this lowest allowable level, potentially interfering signals are allowed to be as large as possible without causing the active circuits to saturate.

To optimize the gain, and thus the signal scaling that is appropriate for a given packet, the minimum acceptable SNR can be calculated, simulated, or found from experimental measurements, and then used to determine the gain. As noted above, the required SNR depends on the complexity of the signal being transmitted.

When transmitting signals when using a multi-carrier modulation type, such as OFDM or DMT, there are included intervals when no information is being transmitted, which intervals are expressed as guard times or guard intervals. A guard time exists between each of the transmitted symbols, and is long enough to span the time of the multi-path echoes that will occur in the channel. In the receiver, these guard times are intentionally ignored, so that the multi-path echoes do not corrupt the decoding of the data. These guard periods can be used to adjust the gain in the receiver without causing data loss due to the temporary disruptions that occur when the gain is changed. There are also other times when it may be appropriate to adjust the gain in the receiver, such as when padding bits are being received.

Because the modulation mapping may change in the middle of a packet (at least after the header), scaling the signal to its optimum level is challenging. Because a conventional receiver does not know the modulation format, and thus the data rate of the body of the packet immediately, it cannot know the optimum scaling to use at the beginning of the packet. Therefore, the receiver must be conservative and size the signal large enough so that even if the most complex modulation mapping is used later in the packet, sufficient SNR will exist so that it is received correctly. While this signal sizing will prove correct if the packet really does contain data modulated in the most complex way, if the packet contains data that is modulated in a less complex way, that signal sizing will have been larger than necessary, and sacrifice potential ability to withstand interference from signals in nearby channels. In setting the signal size, consideration must be given to the worst-case power back-off due to the blocker power.

Example of a multi-modulation format signals are the signals associated with the IEEE 802.11a standard or Hiperlan II standard, which each allow for high-speed local area network communications in the 5 GHz communications band. The signal in the 802.11A standard is allocated into one of twelve different 20 MHz channels. Each of the eight channels is divided into 52 different sub-channels or carriers, of which 48 carriers are able to transmit the signal and 4 of the carriers are used to transmit pilot tones. During transmission, the signal is spread onto each of the 48 carriers associated with the channel according to the modulation technique used, and, upon receipt, is de-spread and demodulated to reconstruct the transmitted signal.

FIG. 1B illustrates the beginning portion of a packet for such an OFDM signal 110, which includes ten short training symbols t1-t10, which are identical to each other and used for signal detection, an initial automatic gain control adjustment, diversity selection, coarse frequency offset estimation and timing synchronization. Two long training symbols T1 and T2 that are also identical to each other are typically used for channel and fine frequency offset estimation. Thereafter exists the SIGNAL symbol, which corresponds to the header referred to above, that contains information indicating the data rate at which the following data, illustrated as Data 1, Data 2, . . . , for the remainder of the packet, will be transmitted. In the 802.11a standard, for each different data rate there is a different modulation mapping, which results in a one-to-one correspondence between the data rate and modulation scheme.

FIG. 2 illustrates a functional block diagram of a conventional receiver 200 that can be used to receive signals. Receiver 200 includes a bandpass filter 202 that receives system input signals from an antenna 201 and outputs a predetermined band of frequencies (while excluding those frequencies higher and lower than the predetermined band). A variable RF amplifier 204 provides an initial amplification to that predetermined band of frequencies. A mixer 206 converts those amplified signals into intermediate frequency (IF) signals, which are then amplified by an IF amplifier 208. At this point, mixers 209 and low pass filters 210 (including both I and Q branches) can generate signals in the desired channel (called the baseband signals). Amplifiers 212 then amplify these baseband signals. At this point, analog to digital converters 214 (provided for both the I and Q branches of low pass filters 210) transform the amplified baseband signals into digital signals that can be analyzed by the rest of receiver 200. Of importance, the gains of RF amplifier 202 and IF amplifier 208 are automatically controlled through digital signals. These gains can be computed using various known power estimation algorithms.

A detector 216 and an auto frequency control (AFC) clock recovery circuit 218 ensure an accurate alignment of the baseband signal. Gain control circuit 220 detects the magnitude of the detected baseband signal from detector 216 during the short training symbol sequence thereof and uses the detected magnitude to adjust the gain of RF amplifier 204, IF amplifier 208, and BB amplifiers 212. A signal timing circuit 222, which also receives the output of detector 216, determines those intervals during which an actual symbol exists, rather than a guard interval, and provides a timing output to an FFT 224 (which also receives the output of detector 216). In this manner, FFT 224 can be gated in time to receive the signal data, rather than noise caused by interference that will exist during a guard interval. FFT 224 provides its output to a channel estimation/pilot phase tracking circuit 226 as well as a channel correction circuit 228.

Channel estimation/pilot phase tracking circuit 226 can obtain a channel estimate during the long training symbol sequence, and provide that channel estimate to channel correction circuit 228. Channel correction circuit 228 can then use the channel estimate to compensate for the determined channel characteristics for the rest of the packet. And, if included, a pilot phase tracker will adjust the channel estimate based upon channel information obtained by tracking pilot tones during the transmission of the rest of the packet. The channel corrected signal is then provided to the demapping/interleaving circuit 230 as well as an FEC decoder 232 (typically a Viterbi decoder) for decoding in a conventional manner.

Of importance, in receiver 200, the information in the packet, including the information contained in the SIGNAL symbol, is not available until FEC decoder 232 has completed its operation, which will not occur until after quite a bit of data, as represented by Data 1, Data 2 . . . , has already been received and amplified by RF amplifier 202 and IF amplifier 208.

In operation, the gain used by gain control circuit 220 is initially determined during the initial short symbol training sequence, and then kept constant for the remainder of the packet. Because the gain is held constant, it must be set at a level that allows the sizing of the received symbols to be large enough such that even if the most complex modulation is used in later symbols in the packet, sufficient SNR will exist, thereby ensuring that such symbols can be received correctly.

Other types of receivers operate by continuously varying the gain to insure that whatever signals are received do not overload the receiver. This variance has at least two disadvantages in a packet-based communication system. First, certain undesired signals may come and go abruptly in a packet-based system. Thus, by the time such undesired signals are detected, the desired packet may already be ruined. Second, because it is necessary to change the gain almost immediately to prevent such overload, the gain might need to be changed in the middle of a symbol. However, changing the gain in the middle of a symbol can cause data to be ruined due to the change in signal magnitude and/or phase.

Accordingly, a need arises for a quick and efficient method to control the timing of gain changes, particularly when the modulation type or the modulation rate change.

SUMMARY OF THE INVENTION

In some wireless local area networks (WLANs), signals of different modulation types can be received. To operate optimally, the gain of an amplifier in the receiving path of a receiver operating on these signals should be set based on the modulation type. For example, CCK modulated packets typically have lower requirements for signal to noise ratio (SNR), but may require more blocker tolerance (that is, an ability to accurately receive signals even when large signals are being transmitted in nearby channels) than OFDM modulated packets. Thus, an amplifier receiving a CCK packet would preferably have a low gain to ensure high blocker tolerance, whereas an amplifier receiving an OFDM packet would preferably have a high gain to ensure a high SNR.

In accordance with one feature of the invention, the gain of a receive path amplifier can be changed based on a unique identifying characteristic in a received data packet. Specifically, the received data packet includes a plurality of symbols, wherein at least one of the symbols includes the unique identifying characteristic. Once the unique identifying characteristic is located, it can be analyzed to determine which modulation type is represented. At this point, the appropriate gain of the amplifier can be set based, at least in part, upon the represented modulation type. Advantageously, subsequent data symbols can be amplified with the set gain, thereby ensuring that the receiver optimally receives those data symbols.

In one embodiment, locating the unique identifying characteristic can include searching the preamble of the received data packet. In this case, analyzing the identifying characteristic could include comparing a pattern in the preamble to a known pattern for each modulation type. A known pattern could include multiple tones having a predetermined spacing and period or a −1/+1 multiplication of signals.

In one embodiment, the gain of the receive path amplifier can be changed based on multiple characteristics. For example, the first characteristic could identify a modulation type, whereas a second characteristic could identify a modulation rate. The gain of the receive path amplifier could advantageously be modified when each of the characteristics is identified. Typically, the gain is first modified based on the modulation type and then modified based on the modulation rate. In one conservative approach, an initial gain of the receive path amplifier can be set low to accommodate large potential blockers.

In one embodiment, the gains of an RF amplifier, an IF amplifier, and/or a baseband amplifier could be modified based on the modulation type. In another embodiment, the gains of the RF amplifier and/or the IF amplifier could be modified based on the modulation rate.

In one embodiment, if the modulation type is a CCK modulation, then the step of locating a second characteristic and modifying the gain of the receive path amplifier to a second gain can be skipped. Specifically, if a CCK modulation type is identified, then irrespective of data rate, the variable gain should provide the same blocker tolerance. In other words, the gain of the amplifier would not change. In contrast, if an OFDM or XR modulation type is identified, then multiple variable gain modifications based on data rate could still be beneficial. For example, eight different blocker tolerances can be applied to 802.11a-compliant OFDM signals depending on the data rate. In this case, the gain of the amplifier would preferably change.

A system for changing a gain of a receive path amplifier is also provided. The receive path amplifier is provided in a receiver that operates upon a received data packet that includes a plurality of symbols. At least one of the symbols includes the unique identifying characteristic. The system can include means for locating the unique identifying characteristic, means for analyzing the identifying characteristic to determine a represented modulation type, means for setting a gain of an amplifier in the receiver to correspond to an appropriate gain that is determined at least in part upon the represented modulation type, and means for amplifying a subsequent data symbol with the set gain.

A variable amplifier that operates upon a received data packet is also provided. The variable amplifier includes an input for receiving the data packet, means for varying a gain of the amplifier based on an identified modulation type of the data packet, and an output for providing amplified signals based on the gain. In one embodiment, the amplifier can further include means for varying the gain of the amplifier based on an identified modulation rate of the data packet.

DETAILED DESCRIPTION OF THE FIGURES

In accordance with one aspect of the invention, automatic gain control is enhanced to improve the blocker tolerance of the receiver. In one embodiment, a worst-case power back off is initially provided due to the blocker power. Then, if the data rate in a received packet increases or a highly modulated signal is detected, then the blocker specification can be relaxed to provide a high signal to noise ratio (SNR), which would be preferred for that packet. Backing off the worst case blocker specification for all packets would penalize the high data rate packets, because analog to digital converter quantization noise may be too high for correct detection. In the present invention, the gains of the variable amplifiers can be changed during receipt of the packet, thereby advantageously increasing receiver performance.

Figure 1A:
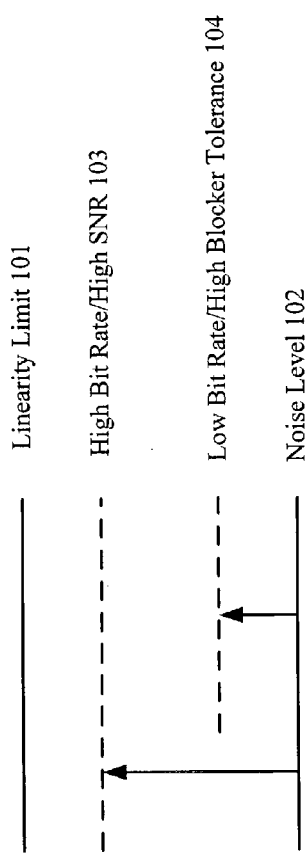
FIG. 1A illustrates the desired signal to noise ratio (SNR) as well as blocker tolerance for high bit rate signals and low bit rate signals.
Figure 1B:
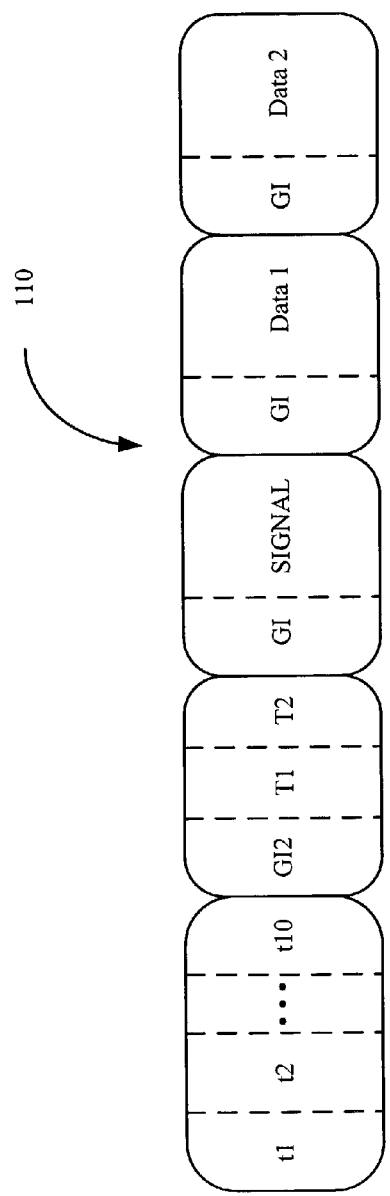
FIG. 1B illustrates a data packet format for an OFDM signal.

For illustration purposes, the enhancement to automatic gain control is now discussed in the context of an OFDM signal. As noted in FIG. 1B, the OFDM signal includes a 24-bit SIGNAL symbol, which is transmitted in the header at the beginning of a packet. If the OFDM signal is BPSK modulated with rate=1/2 coding, then 6 encoded (3 decoded) bits of the SIGNAL symbol indicate the transmission rate of subsequent data symbols. Note that decoding of the SIGNAL symbol would typically take all 24 bits and perform a trace back from the end. This trace back would provide the 3 decoded bits. However, the time to perform this trace back is undesirably long. Therefore, in accordance with one feature of the invention, the 6 most likely coded bits are identified for decoding.

In the IEEE 802.11a standard, eight possible transmission rates can be used. These eight transmission rates are identified in Table 1.

TABLE 1

| | |
|---|---|
| 0 | 6 Mb |
| 1 | 9 Mb |
| 2 | 12 Mb |
| 3 | 18 Mb |
| 4 | 24 Mb |
| 5 | 36 Mb |
| 6 | 48 Mb |
| 7 | 54 Mb |

In one embodiment, the automatic gain control circuit will initially assume that each packet is transmitted with the lowest rate modulation, e.g. 6 Mb, and have gain settings corresponding thereto, and then, if necessary, change the gain setting during receipt of the packet.

To operate most efficiently, a gain setting should be changed prior to the receiving the first data symbol. Accordingly, to decode the data rate in the header prior to the reception of the initial data symbol requires a fast decoder that operates in parallel with the main receiver chain. After the 3 bits of SIGNAL information are decoded, another gain setting, if needed, will be set and used for the rest of the packet.

Note that this new gain setting would preferably settle within the duration of the guard time between the header containing the SIGNAL information and the first of the data symbols. Specifically, referring back to FIG. 1B, the guard bands GI2 and GI (first instance) can be used conventionally whereas the guard band GI (second instance) can be advantageously used as a period during which the gain can be changed, if needed, prior to the receipt of the first data symbol Data 1.

Figure 2:
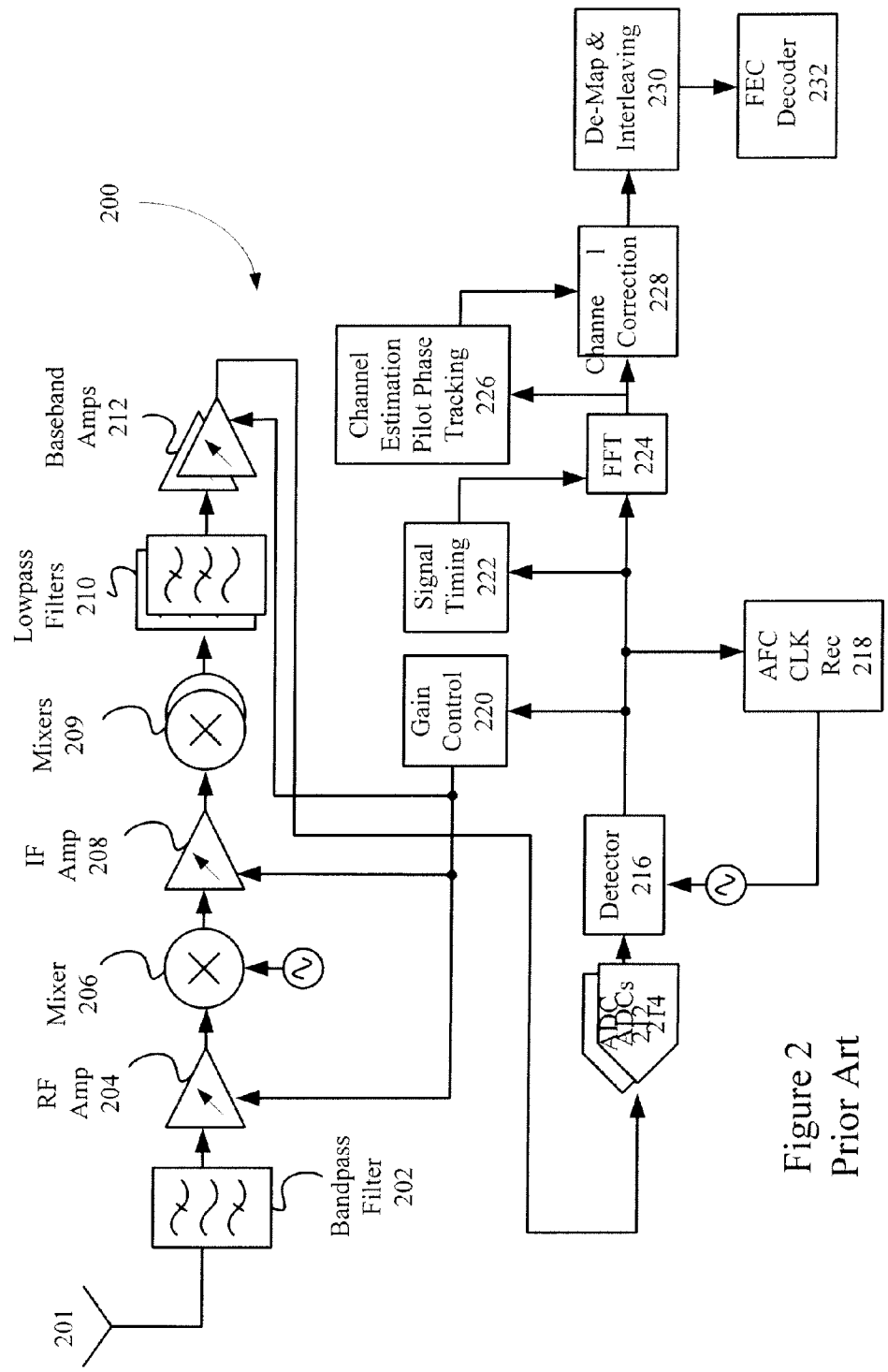
FIG. 2 illustrates a block diagram of a conventional receiver.
Figure 3:
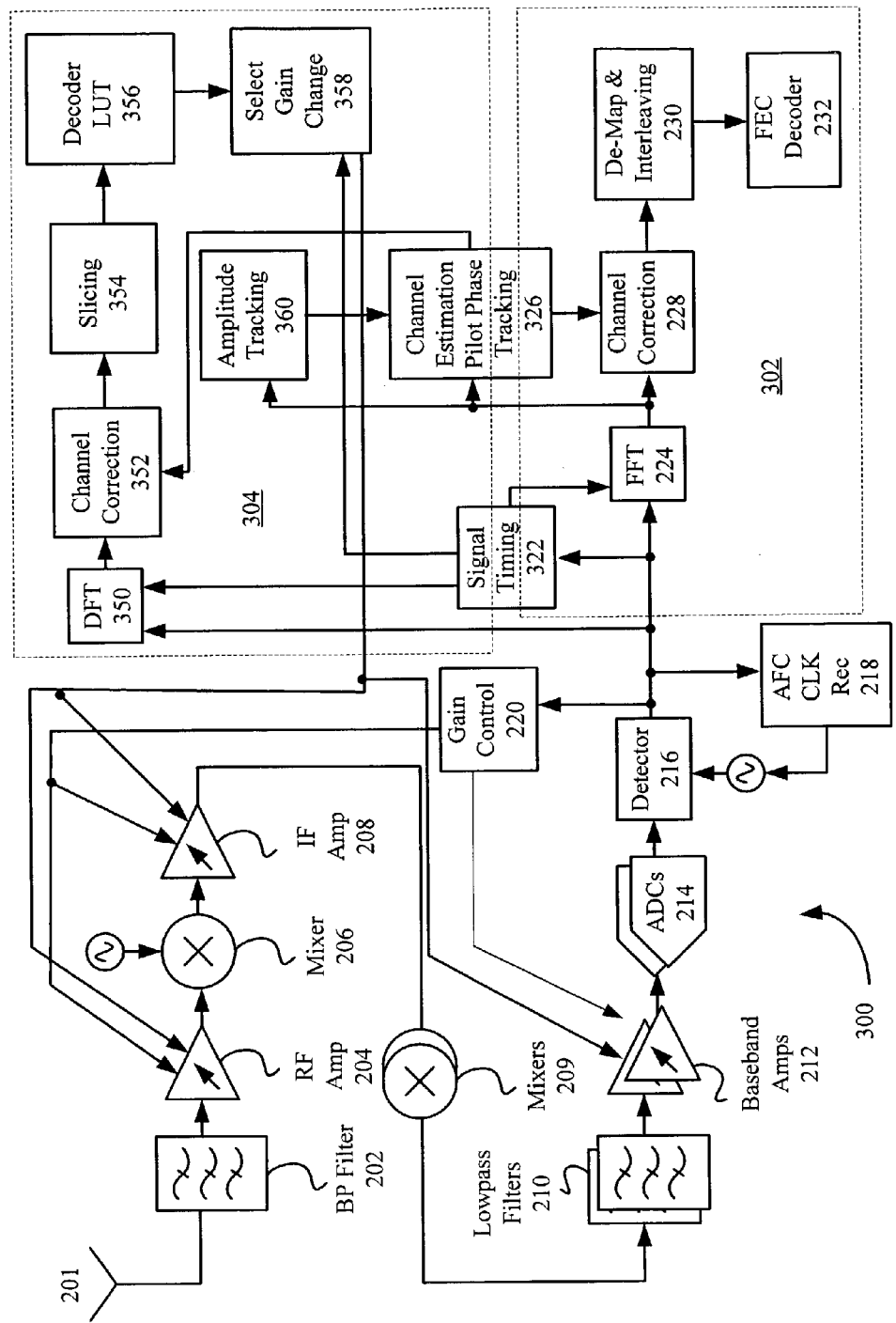
FIG. 3 illustrates a block diagram of a receiver that can automatically change the gains of variable amplifiers during receipt of a packet.

FIG. 3 illustrates a block diagram of a receiver 300 that can automatically change the gains of variable amplifiers during receipt of a packet. Receiver 300, in general, includes a conventional signal detection block 302 and an early signal detection block 304. Conventional signal detection block 302 can include FFT 224, channel correction circuit 228, demapping and interleaving circuit 230, and decoder 232, which operate as discussed in reference to FIG. 2. For context, also illustrated are antenna 201, RF amplifier 202, BP filter 204, mixer 206, IF amplifier 208, low pass filters 210, baseband amplifiers 212, ADCs 214, detector 216, AFC clock recovery circuit 218, and gain control circuit 220, each of which also operates as discussed in FIG. 2.

Note that signal timing circuit 222 as well as channel estimation/pilot phase tracking circuit 226 can be modified to interface with early signal detection block 304. Therefore, these components have been labeled as signal timing circuit 322 and channel estimation/pilot phase tracking circuit 326 and are shown as being associated with both conventional signal detection block 302 and early signal detection block 304.

In accordance with one feature of the invention, early signal detection block 304 can quickly detect the 3 decoded bits from the SIGNAL symbol that identify the data rate of subsequent data. From these bits, a determination can be made whether the gain setting needs to change based upon the contents of the SIGNAL symbol. If so, then early signal detection block 304 can advantageously change the gains of RF amplifier 202 and IF amplifier 208.

In this embodiment, early signal detection block 304 includes signal timing circuit 322, channel estimation/pilot phase tracking circuit 326, a discrete Fourier transform (DFT) circuit 350, a channel correction circuit 352, a slicing circuit 354, a decoder lookup table (LUT) 356, a select gain change circuit 358, and an amplitude tracking circuit 360. In operation, signal timing circuit 322 keeps track of the time that has elapsed since the beginning of a signal to determine the appropriate time to trigger DFT circuit 350 to input the SIGNAL symbol. Because the SIGNAL symbol will occur at the same time in every packet, keeping track of the time allows DFT circuit 350 to input the (still modulated) SIGNAL symbol. Signal timing circuit 322 operates using a short cyclic recognition circuit of conventional design that detects the existence of the short training symbols. When the repetition ends (taking into consideration multi-path echoes and the like), it is assumed that the signal is at the end of the short training sequence. From that point, signal timing circuit 322 waits a period of time corresponding to the long training symbols and the guard intervals that will occur before the SIGNAL symbol is transmitted and then generates a pulse or other signal to DFT circuit 350 indicating that it should begin obtaining samples of the signal corresponding to the SIGNAL symbol. Note that this pulse will also correspond to the pulse applied to FFT 224 for the SIGNAL symbol.

After receiving that pulse, DFT circuit 350 obtains samples of the 3 bits of SIGNAL data, and calculates a discrete Fourier transform for each of the six frequencies on which the SIGNAL symbol has been spread, which are known to be at the −26, −23, −19, −16, −13, and −10 bins that correspond to these frequencies on a −32 to 31 scale in the IEEE 802.11a standard. These frequencies contain the encoded rate=1/2, three-bit (allowing for identification of each of the eight different rates) rate field from the SIGNAL symbol. Each of the six DFT outputs from DFT circuit 350 are in real and quadrature, as is known. At the same time, FFT 224 also samples the SIGNAL symbol.

For both DFT circuit 350 and FFT circuit 224, samples at the end of the guard interval may be used, whereas the last few samples of the symbol may not be used (i.e. if the peak of the impulse response of the aggregate channel response and filter response is not the first tap). This choice of sampling is then preferably used for all symbols, and the delay in time creates a linear phase across the frequencies. Timing is maintained by adjusting a phase slope in frequency (same as a delay in time) within a given range. The six DFT outputs of DFT circuit 350 are then input to channel correction circuit 352, which performs channel correction on the six DFT outputs, based upon the channel estimation obtained from the channel estimator within channel estimation and pilot phase tracking circuit 326.

Channel correction circuit 352 operates by multiplying the six different outputs from DFT circuit 350 with the appropriate inverted channel estimate provided by channel estimation/pilot phase tracking circuit 326. The inverted channel estimate is obtained based upon the training symbols in the OFDM signal. Because the training symbols are transmitted at unity magnitude and zero phase, the effect of the airwaves over which the signal has been transmitted on the magnitude and phase of the training symbols can be determined. This effect can then be inverted and applied to each of the six different outputs from channel correction circuit 352 to obtain six different channel corrected complex numbers representing the outputs.

Further, each of the six DFT outputs, whether before or after channel correction, are also normalized using the output from amplitude tracking circuit 360. Amplitude tracking circuit 360 determines the magnitude of the largest component (I or Q), and the channel correction circuit complex normalizes each of the six DFT outputs. The largest component is preferably determined based upon the power of the signal on the pilot symbols, or, alternatively, the training symbols, which are each typically transmitted at a unity magnitude and zero phase, as detected during the period corresponding to the reception of the training symbols associated with the packet.

Each of the six different channel corrected and normalized complex numbers is then sliced to determine if it corresponds to a digital "1" or a digital "0" by slicing circuit 354. Because the SIGNAL symbol is BPSK modulated (in this example), only the signs of the real portions of these six different complex numbers are needed to obtain the decoded SIGNAL symbol. In other words, determining whether a BPSK encoded bit is positive or negative (corresponding to a "0" or "1", respectively) can be easily discerned from looking at the sign of the real portion of the complex number. Specifically, if the sign if positive, then that bit is a "0", and if the sign is negative, then that bit is "1". Based upon the sign from the real portion of each of these six numbers, which one of the eight possible transmission rates that the remaining data symbols within the packet are transmitted at can be determined. Slicing circuits that perform as described are well known.

Decoder lookup table 360 receives the sign of each of the six numbers, with, for the example herein, 0=positive and 1=negative, and determines the one out of the 64 possible combinations of those six numbers (identified in the Table 2 below by as (sign0, sign1, sign2, sign3, sign4, sign5)) that results in one of the eight different rates the following data symbols are encoded at.

TABLE 2

| | | | |
|---|---|---|---|
| 000000: 4 | 010000: 2 | 100000: 2 | 110000: 2 |
| 000001: 0 | 010001: 3 | 100001: 3 | 110001: 3* |
| 000010: 1 | 010010: 2 | 100010: 2 | 110010: 2* |
| 000011: 5 | 010011: 2 | 100011: 2 | 110011: 2 |
| 000100: 0 | 010100: 0 | 100100: 0 | 110100: 7 |
| 000101: 0* | 010101: 0 | 100101: 0 | 110101: 3 |
| 000110: 1* | 010110: 1 | 100110: 1 | 110110: 2 |
| 000111: 0 | 010111: 0 | 100111: 0 | 110111: 6 |
| 001000: 4* | 011000: 4 | 101000: 4 | 111000: 7 |
| 001001: 4 | 011001: 3 | 101001: 3 | 111001: 3 |
| 001010: 4 | 011010: 2 | 101010: 2 | 111010: 2 |
| 001011: 5* | 011011: 5 | 101011: 5 | 111011: 6 |
| 001100: 4 | 011100: 7 | 101100: 7 | 111100: 7* |
| 001101: 0 | 011101: 0 | 101101: 0 | 111101: 6 |
| 001110: 1 | 011110: 1 | 101110: 1 | 111110: 6 |
| 001111: 5 | 011111: 6 | 101111: 6 | 111111: 6* |

The table values are a function of the convolutional encoder used in the IEEE 802.11a standard and the eight values that correspond to the eight ideal rates within an 802.11a system are identified with an asterisk (*). If a different signal having a different error encoding is used, a corresponding maximum likelihood decoder table based upon the error encoding used can easily be constructed.

With respect to the Table 2, an error in more than one of the detected signs is needed in order to produce an incorrect result. Thus, even if signal degradation occurs for some reason, the present invention will still be able to properly identify the data rate encoded into the SIGNAL symbol.

It is also noted that a complex phase correction of the normalized result obtained by channel correction circuit 352 can also occur if samples were obtained that include the guard interval and a timing back off parameter was used to determine which of the samples identify the symbol. For example, if 80 samples were taken in the embodiment described above, 16 will represent the guard interval. The timing back off parameter will indicate where within the 80 samples is the first sample that does not correspond to the guard interval, which can be determined using conventional techniques.

Based upon which one of the eight different data rates is selected, select gain change circuit 358 can determine what the appropriate gain for that data rate should be. In a preferred embodiment of the invention, approximately half of the short training symbols are used to initially adjust the gain based upon the channel conditions for the BPSK symbol. The present invention uses the already determined gain and modifies it based upon the determined data rate/modulation type.

In this embodiment, at substantially the time the gain for the appropriate data rate is determined, receiver 300 will be inputting data corresponding to the guard interval between the SIGNAL symbol and the first data symbol. In other systems, where there may be several symbols between the equivalent of the SIGNAL symbol and the first data symbol, the automatic gain control amplifier should preferably still have its gain changed during a guard interval. Accordingly, this is illustrated in FIG. 3 by the signal line from the symbol timing circuit 322 to select gain change circuit 258, which will transmit an appropriate pulse aligned with the beginning of a guard interval indicating that the gain should be changed at that time. More generally, for any modulation type being used, any period during which redundant information is being sent may be used for changing the gain because the receiver may be unable to process signals correctly for a short time while changing gain.

For each subsequent packet that is received, the same operations and circuits as described above are used. Because there is some likelihood that the data in a subsequent packet will have the same data rate as the previous packet, this likelihood could be used, if desired, as a default for the data rate in a packet for which, for some reason, there has been difficulty in decoding the data rate within the SIGNAL symbol within the desired amount of time.

Because in this example there is a one-to-one correspondence between the data rate and the modulation type, identifying the data rate also provides the type of modulation used. Note that even if this one-to-one correspondence does not exist, then early signal detection block 304 can still be used.

For example, the 802.11a standard defines communication in the 5 GHz band using data rates of 6, 12, 18, 24, 36, and 54 Mbps. The 802.11b standard defines communication in the 2.4 GHz band using data rates of 1, 2, 5.5, and 11 Mbps. A recent proposed addition to the 802.11 standards, called the 802.11g standard, uses the high data rates of 802.11a in the frequency band of 802.11b, i.e. 2.4 GHz. To ensure backwards compatibility with 802.11b devices while allowing data rate increases, the 802.11g standard incorporates the modulation types from both the 802.11a and 802.11b standards (wherein the 802.11b standard uses CCK modulation and the 802.11a standard uses OFDM modulation).

CCK packets typically have lower requirements for SNR, but may require more blocker tolerance than OFDM packets. XR packets may require even less SNR, but may require even more blocker tolerance than CCK packets. Due to the format differences between CCK, XR, and OFDM packets, the variable gain modifications can be made at different times. In accordance with one aspect of the invention, a first variable gain modification can be made after the modulation type is identified and a second variable gain modification can be made after the modulation rate is identified. These modifications will be further described in reference to FIGS. 4A, 4B, 5, and 6.

Figure 4A:
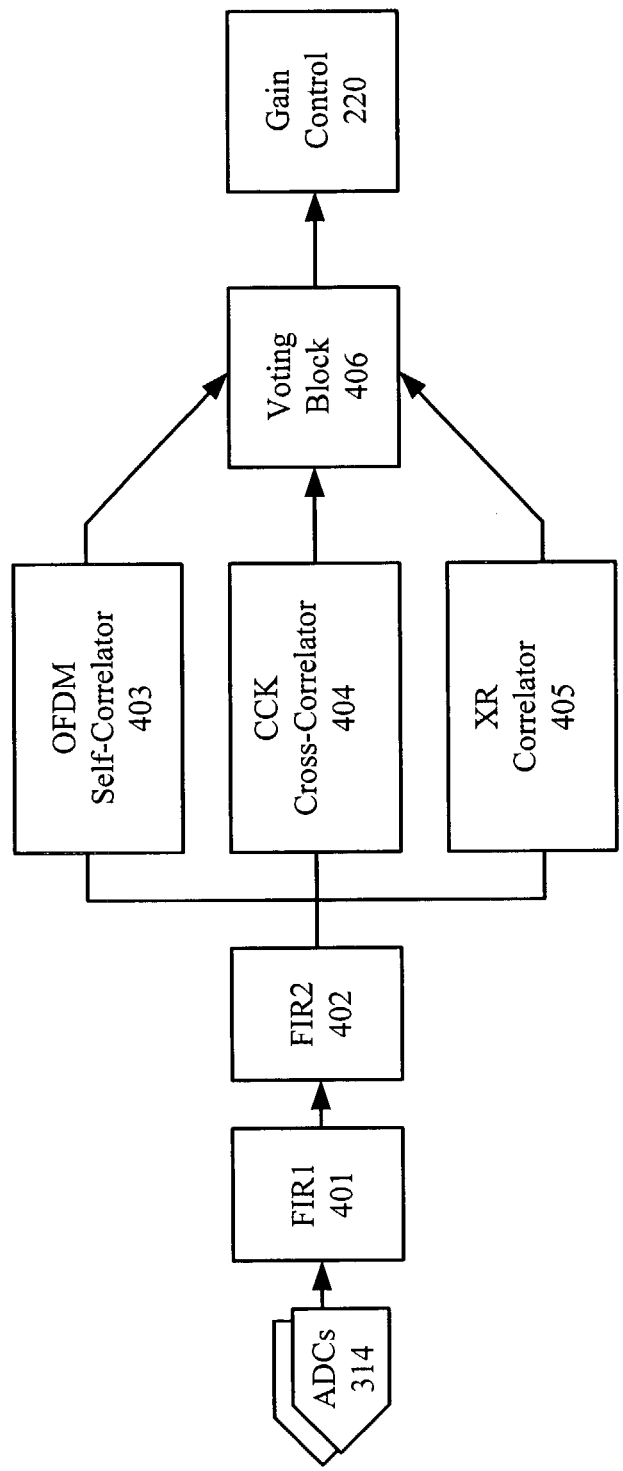
FIG. 4A illustrates components that can be added to the receiver of FIG. 3 to identify the modulation type of the received signal.

For example, FIG. 4A illustrates components that can be added to receiver 300 to identify the modulation type of the received signal. Specifically, a finite impulse response (FIR 1) filter 401 can be used to provide a down sample of 2 to the output signals of ADCs 314 (typically only used in 802.11a mode). Another FIR (i.e. FIR 2) filter 402 can be used to filter out any nearby blocking signals. The output signal of filter 402 can be provided to three correlators: an OFDM self-correlator 403, a CCK cross-correlator 404, and an XR cross-correlator 405. In accordance with one embodiment, each of correlators 403, 404, and 405 compares the output signal of filter 402 to a unique characteristic associated with its modulation type. Note that the term "characteristic" can refer to any number of identifying means including, for example, patterns and/or periodicity of a given period.

Figure 4B:
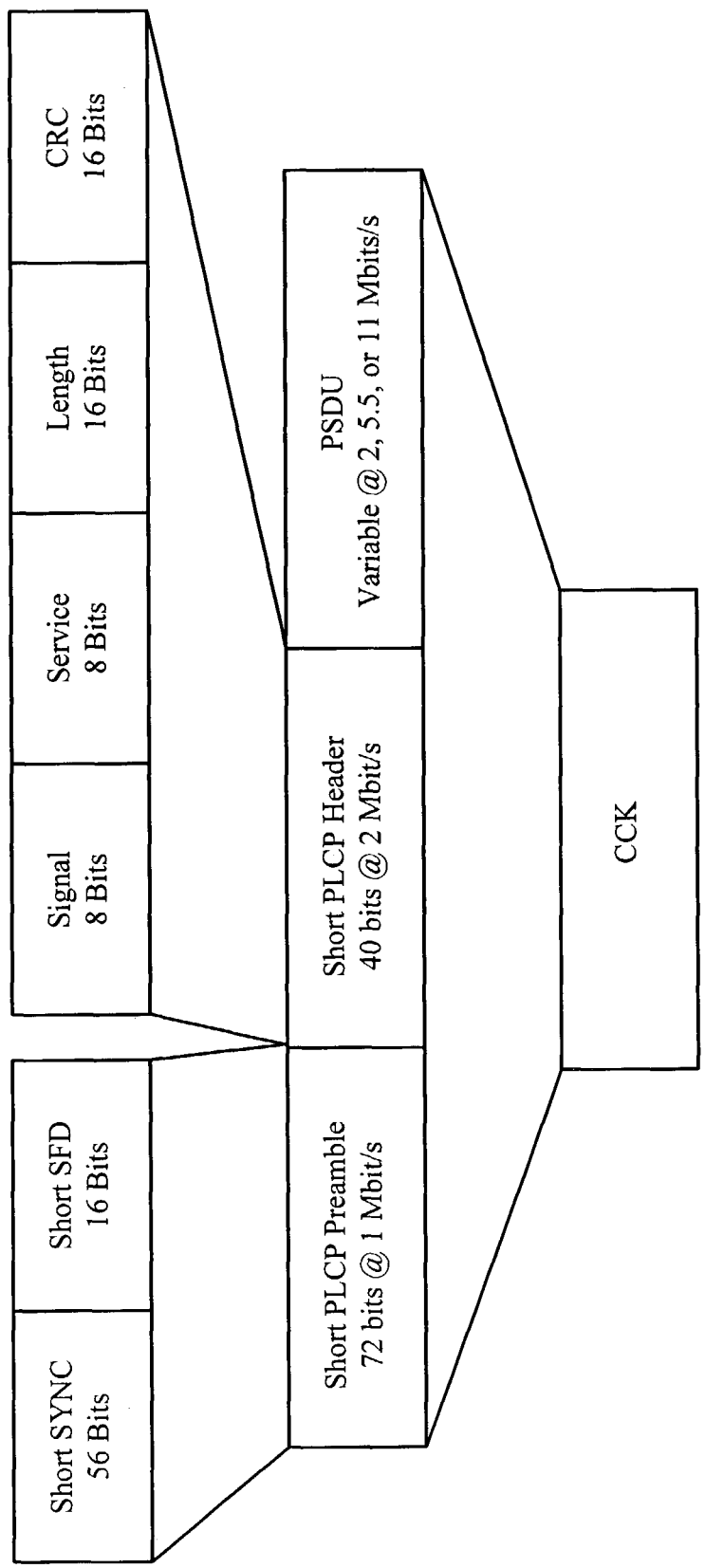
FIG. 4B illustrates a data packet format for a CCK signal.

For example, in an OFDM preamble, twelve tones (complex sinusoidals) are spaced (peak to peak) at 1.2 MHz with a period of 0.8 usec. Each of ten short training symbols t1-t10 (see FIG. 1) has these twelve sub-carriers, thereby establishing an OFDM pattern. Therefore, the output will be fully periodic, even in multipath. Thus, looking for periodicity of 0.8 microseconds is very effective to find the preamble, even in low SNR and heavy multipath. Hence, the term "self-correlator" is appropriate in OFDM. In contrast, in a CCK preamble (i.e. a SYNC signal shown in FIG. 4B, Barker signals (an 11-chip spreading code) are multiplied by either −1 or +1. Note that FIG. 4B illustrates a short CCK format, in contrast to a long CCK format (as defined by the 2001 draft supplement to the IEEE 802.11b standard). However, the −1/+1 multiplication is applied in a similar manner, thereby establishing a CCK pattern. Hence, the term "cross-correlator" is appropriate in CCK. In an XR preamble, 15 symbols (called mediums) of duration 1.6 us at the base rate (32 samples at Nyquist rate) are provided. These mediums are combined with a secondary PN codes, such that each medium has a predetermined sign (i.e. +/−). Preamble detection operates by cross-correlating the input signal with a single medium, then self-correlating this output over a gap of the duration of a medium. Therefore, an XR signal can have both self- and cross-correlation aspects. (Note that the XR signal is a proprietary OFDM-based modulation available through Atheros Communications, Inc. XR signals have a lower bit rate than OFDM signals and therefore have even greater blocker tolerances.

Each of correlators 403, 404, and 405 provides a correlation value to a voting block 406 based on the unique characteristics associated with its modulation type. A correlation value indicates the likelihood that the signal output by filter 402 is of a certain modulation type. In one embodiment, voting block 406 determines the highest of the three correlation values, thereby designating the most probable modulation type. At this point, voting block 406 can provide this designation to gain control circuit 220, which in turn can modify the gains of RF amplifier 202 and IF amplifier 208 (shown in FIG. 3).

Of importance, DFT 350, channel correction circuit 352, slicing circuit 354, decoder LUT 356, and select gain change circuit 358 can operate using the same processes described for the OFDM SIGNAL. In this manner, the modulation type can also be advantageously used to modify the gains of RF amplifier 202 and IF amplifier 208. Note that because no DC or channel estimation has yet occurred at this point, the gain of baseband amplifiers 212 can also be modified by early signal detection block 304 (as indicated by the dotted line). Of importance, because the preamble precedes other portions of a modulated signal, the gains of RF amplifier 202, IF amplifier 208, and baseband amplifiers 212 can be modified earlier than waiting for subsequent portions of the modulated signal. These variable gains could be further modified after the modulation rate is identified.

In another embodiment, modification of the variable amplifiers could be performed after complete analysis by early signal detect circuit 304. At this point, the appropriate gain modifications could be made based on multiple portions of the modulated signal. This embodiment can be used effectively in modulated signals having a very short preamble (e.g. an OFDM signal).

Figure 5:
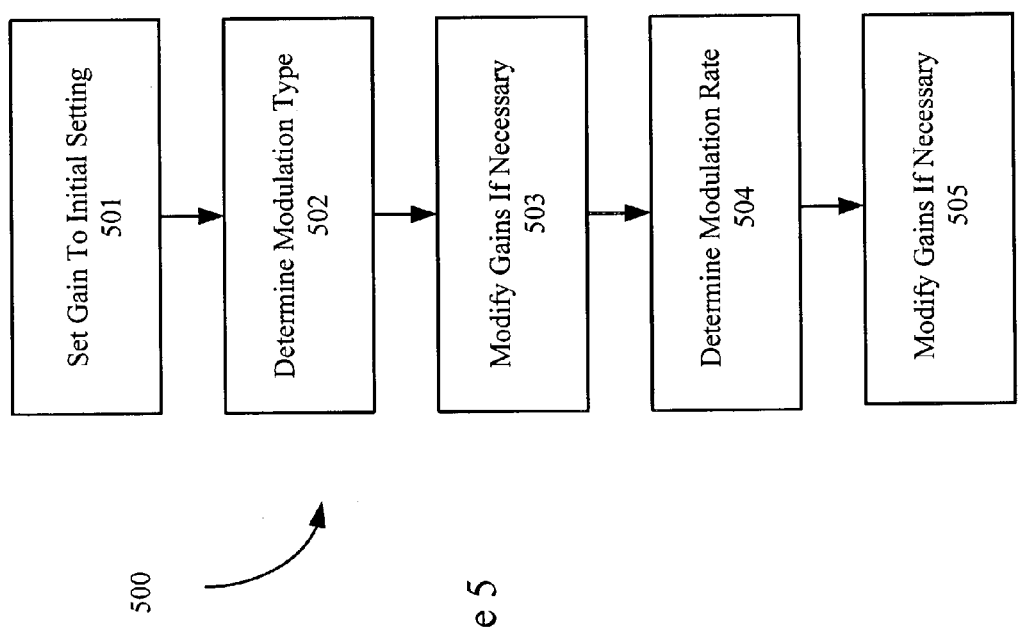
FIG. 5 illustrates an exemplary process that can be used to modify variable gains at multiple times during the receipt of a modulated signal.

FIG. 5 illustrates an exemplary process 500 that can be used to modify variable gains at multiple times during the receipt of a modulated signal. Specifically, an initial gain can be set in step 501. In one embodiment, this initial gain is a lower gain to accommodate large potential blockers. In step 502, the modulation type can be determined using unique characteristics associated with the modulated signal. In one embodiment, this modulation type can be used to modify any variable amplifier gains, e.g. RF, IF, and/or baseband amplifiers, in step 503. At this point, using subsequent portions of the modulated signal, the modulation rate can be determined in step 504. The variable amplifier gains can be further modified based on the modulation rate in step 505. Of importance, at either step 503 or step 505, the gain can be increased to result in a higher SNR and a lower blocker tolerance.

Note that once a modulation type is identified in step 502 and a corresponding gain modification is made in step 503, additional steps to adjust the variable gain may be unnecessary. Specifically, if a CCK modulation type is identified, then irrespective of data rate, the variable gains should provide the same blocker tolerance, as the 802.11b specification requires the same blocker tolerance for all rates. In contrast, if an OFDM or XR modulation type is identified, then multiple variable gain modifications based on data rate could still be beneficial. For example, eight different blocker tolerances can be applied to OFDM signals depending on the data rate.

Figure 6:
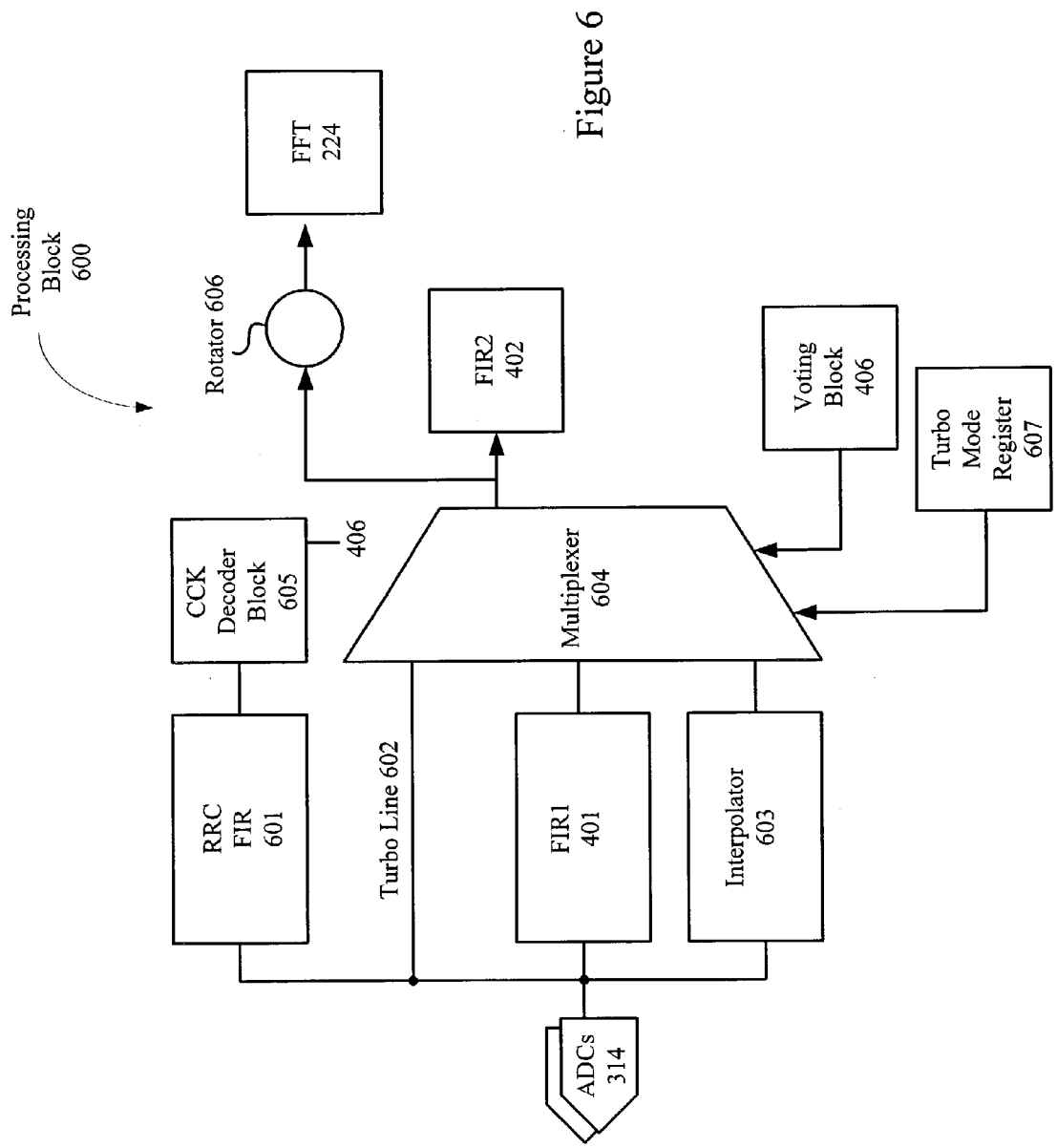
FIG. 6 illustrates a processing block that can be provided in a receiver. This processing block can change its output based on the identified modulation type.

In one embodiment, the vote designation generated by voting block 406 can also be provided to other components to facilitate optimal processing of the received signals. For example, FIG. 6 illustrates a processing block 600 that can be provided in a receiver. For context, ADCs 314, filters 401 and 402, as well as FFT 224 are shown. In processing block 600, a multiplexer 604 receives inputs from a Turbo line 602, filter 401, and an interpolator 603. Multiplexer 604 can be controlled by the output generated by voting block 406 and a turbo mode register 607.

A root-raised cosine (RRC) FIR filter 601 can be used when a CCK modulation type is identified, the received data rate is identified to be 44 MHz, and the desired data rate is identified to be 22 MHz. Filter 601 ensures that the subsequent data symbols are correctly converted from 44 MHz to the desired 22 MHz and then provided to a CCK decoder block 605 (note that if a CCK signal is identified in voting, then CCK decoder block 605 is activated, otherwise it is turned off for the duration of the packet). Turbo signal line 602 can be selected (by a signal from a turbo mode register 607) when an OFDM modulation type is identified and the data rate received and desired is 80 MHz (i.e. twice as fast as a standard 802.11a signal). Filter 401 can be selected when an OFDM modulation type is identified, the received data rate is identified to be 80, and the desired data rate is identified to be 40 MHz. Interpolator 603 can be selected when an OFDM modulation type is identified, the received data rate is identified to be 44, and the desired data rate is identified to be 40 MHz. An exemplary interpolator 603 is described in U.S. patent application Ser. No. 10/367,527, entitled "Receiving and Transmitting Signals Having Multiple Modulation Types Using Sequencing Interpolator", filed on Feb. 14, 2003 by Atheros Communications, Inc., which is incorporated by reference herein. The processed signals selected by multiplexer 604 can then be provided to both filter 402 as well as rotator 606. In one embodiment, rotator 606 adjusts the frequency offset and essentially replaces detector 216 and AFC clock recovery circuit 218 (FIG. 3). Rotator 606 provides its output to FFT 224, which along with the other components in receiver 300, operate to accurately reconstruct the received signals.

While the present invention has been described herein with reference to particular embodiments thereof, a latitude of modification, various changes and substitutions are intended in the foregoing disclosure. For example, while the present invention as described quickly decodes a small number of bits used to identify the data rate of subsequent data symbols, other bits which may need to be quickly identified, for reasons unrelated to gain, can also be decoded in a similar manner. Additionally, CCK modulated packets typically, but not always, have lower requirements for SNR. For example, the highest CCK rate of 11 Mbs requires a higher SNR than the lowest OFDM rate of 6 Mbps. It will thus be appreciated that in some instances some features of the invention will be employed without a corresponding use of other features without departing from the spirit and scope of the invention as set forth in the appended claims.

The invention claimed is:

1. A method of changing a gain of a receive path amplifier in a receiver that operates upon a received data packet including a plurality of symbols, at least one of the symbols including a unique identifying characteristic, the method comprising:
   locating the unique identifying characteristic;
   analyzing the unique identifying characteristic to determine a represented modulation type;
   setting a gain of an amplifier in the receiver to correspond to an appropriate gain that is determined at least in part upon the represented modulation type; and
   amplifying a subsequent data symbol in the received data packet with the set gain.

2. The method of claim 1, wherein locating the unique identifying characteristic includes searching a preamble of the received data packet.

3. The method of claim 2, wherein analyzing the unique identifying characteristic includes comparing a pattern in the preamble to a known pattern for each modulation type.

4. The method of claim 3, wherein the known pattern includes multiple tones having a predetermined spacing and period.

5. The method of claim 3, wherein the known pattern includes a −1/+1 multiplication of signals.

6. The method of claim 2, wherein the unique identifying characteristic includes at least one of a self-correlating characteristic and a cross-correlating characteristic.

7. A method of changing a gain of a receive path amplifier in a receiver, the method comprising:
   receiving a data packet including a plurality of symbols;
   locating a first characteristic in the plurality of symbols that identifies a modulation type;
   modifying the gain of the receive path amplifier to a first gain that is determined at least by the modulation type;
   locating a second characteristic in the plurality of symbols that identifies a modulation rate; and
   during reception of the data packet, modifying the gain of the receive path amplifier to a second gain that is determined at least by the modulation rate.

8. The method of claim 7, wherein an initial gain of the receive path amplifier is set low to accommodate large potential blockers.

9. The method of claim 7, wherein the receive path amplifier can include at least one of a Radio Frequency (RF) amplifier, an Intermediate Frequency (IF) amplifier, and a baseband amplifier.

10. The method of claim 7, wherein the first gain increases a signal to noise ratio and lowers a blocker tolerance.

11. The method of claim 7, wherein the second gain increases a signal to noise ratio and lowers a blocker tolerance.

12. The method of claim 7, wherein if the modulation type is an Orthogonal Frequency Division Multiplexing (OFDM) modulation, then locating the second characteristic includes detecting certain encoded bits in one of the plurality of symbols.

13. The method of claim 7, wherein locating the first characteristic includes searching a preamble of the data packet.

14. The method of claim 13, wherein locating the first characteristic further includes comparing a pattern in the preamble to a known pattern for each modulation type.

15. The method of claim 14, wherein the known pattern includes multiple tones having a predetermined spacing and period.

16. The method of claim 14, wherein the known pattern includes a −1/+1 multiplication of signals.

17. The method of claim 14, wherein the first characteristic includes at least one of a self-correlating characteristic and a cross-correlating characteristic.

18. A system for changing a gain of a receive path amplifier in a receiver that operates upon a received data packet including a plurality of symbols, at least one of the symbols including a unique identifying characteristic, the system comprising:
   means for locating the unique identifying characteristic;
   means for analyzing the unique identifying characteristic to determine a represented modulation type;
   means for setting a gain of an amplifier in the receiver to correspond to an appropriate gain that is determined at least in part upon the represented modulation type; and
   means for amplifying a subsequent data symbol in the received data packet with the set gain.

19. The system of claim 18, wherein the means for locating the unique identifying characteristic includes means for searching a preamble of the received data packet.

20. The system of claim 18, wherein the means for analyzing the unique identifying characteristic includes means for comparing a pattern in a preamble of the received data packet to a known pattern for each modulation type.

* * * * *